United States Patent [19]
Lee et al.

[11] Patent Number: 6,165,811
[45] Date of Patent: Dec. 26, 2000

[54] METHOD OF FABRICATING A HIGH POWER SEMICONDUCTOR LASER WITH SELF-ALIGNED ION IMPLANTATION

[75] Inventors: Jung Kee Lee; Kyung Hyun Park; Ho Sung Cho; Eun Soo Nam; Dong Hoon Jang, all of Taejon, Rep. of Korea

[73] Assignees: Electronics and Telecommunications Research Institute, Taejon; Korea Telecom, Sungnam-Shi, both of Rep. of Korea

[21] Appl. No.: 09/195,690

[22] Filed: Nov. 19, 1998

[30] Foreign Application Priority Data

Sep. 21, 1998 [KR] Rep. of Korea ............... 98-38955

[51] Int. Cl.[7] ............................................. H01L 21/00
[52] U.S. Cl. ............................ 438/45; 438/40; 438/43
[58] Field of Search .................... 438/39, 40, 42, 438/43, 45, 46

[56] References Cited

U.S. PATENT DOCUMENTS

| | | |
|---|---|---|
| 5,020,067 | 5/1991 | Okada . |
| 5,208,183 | 5/1993 | Chen et al. . |
| 5,256,580 | 10/1993 | Gaw et al. ............................ 438/39 |
| 5,637,511 | 6/1997 | Kurihara ............................... 438/45 |
| 5,696,784 | 12/1997 | Srinivasan et al. . |
| 5,717,707 | 2/1998 | Beernink et al. ..................... 372/46 |
| 5,786,234 | 7/1998 | Nagai et al. .......................... 438/40 |
| 5,832,019 | 11/1998 | Paoli et al. ........................... 372/46 |

OTHER PUBLICATIONS

Harry Asonen et al., "Aluminum–Free 980–nm GaInAs/GaInAsP/GaInP Pump Lasers", IEEE Journal of Quantum Electroncs, vol. 30, No. 2, Feb. 1994, pp. 415–423.

G. Allen Vawter et al., "Low Threshold Current Implanted–Planar Buried–Heterostructure Graded–Index Separate Confinement Heterostructure Laser in GaAs/AlGaAs", Appl. Phys. Lett. 56(20), May 14, 1990, pp. 1945–1947.

Y.K. Chen et al., "Self–Aligned InGaAs/GaAs/InGaP Quantum Well Lasers Prepared by Gas–Source Molecular Beam Epitaxy with Two Growth Steps", Appl. Phys. Lett. 59(23), Dec. 2, 1991, pp. 2929–2931.

*Primary Examiner*—Kevin M. Picardat
*Attorney, Agent, or Firm*—Jacobson, Price, Holman & Stern, PLLC

[57] ABSTRACT

A method of fabricating a semiconductor laser comprises the steps of sequentially depositing a lower cladding layer, an active layer, a first upper cladding layer, an etching stop layer, a second upper cladding layer and an ohmic contact layer over a compound semiconductor substrate, forming an etching mask over the ohmic contact layer so as to expose channel regions and to shield the ridge regions between the channel regions, performing wet etching to etch the ohmic contact layer and the second upper cladding layer so as to expose the etching stop layer so as to form the channels and the ridges having narrower widths than the parts of the etching mask shielding the ridge regions, and implanting dopant ions into the parts of the first upper cladding layer and the active layer below the channels to form ion-implanted regions by using the etching mask as the ion implantation mask.

7 Claims, 5 Drawing Sheets

METHOD OF FABRICATING A HIGH POWER SEMICONDUCTOR LASER WITH SELF-ALIGNED ION IMPLANTATION

BACKGROUND OF THE INVENTION

1. Field of the Invention

The present invention concerns a high power semiconductor laser used in the optical communications, and more particularly a method of fabricating a high power semiconductor laser with the ridge type waveguide which is provided with ion implanted regions formed symmetrically at both sides of the ridge with the same interval.

2. Technical Background

The semiconductor laser lasing at wavelength of 0.98 μm (hereinafter referred to as 0.98 μm semiconductor laser) is used as a pumping light source for erbium (Er) doped fiber amplifiers. Such semiconductor laser is mostly built by ridge waveguide (RWG) structure, since it has a low optical power density at the output facet compared to other structures so that the energy level of the catastrophic optical damage (COD) becomes high. However, the semiconductor laser of RWG structure is based on weaking index-guiding, so that the fundamental lateral mode may not be maintained, but mixed with a higher-order lateral mode, when it is operated at high output power. This higher-order lateral mode emerge results in the kinks and beam steering of the optical output without being linearly proportional to the drive current, thereby degrading the usability of the semiconductor laser as the pumping light source. Especially, it irregularly varies the optical coupling efficiency between the semiconductor laser and the optical fiber. In order to prevent such higher-order lateral mode lasing, there have been proposed ion implanted regions formed in the channel regions of the semiconductor laser, so that it may make the fundamental lateral mode lasing regardless of the drive current and the optical output power.

Describing the conventional method of fabricating the 0.98 μm of RWG structure in connection with FIGS. 1A to 1E, sequentially deposited by crystal growing over a compound semiconductor substrate 100 are a lower cladding layer 101, an active layer 102, a first upper cladding layer 103, an etching stop layer 104, a second upper cladding layer 105 and an ohmic contact layer 106, as shown in FIG. 1A. The active layer may be made of a single layer or a composite layer consisting of a lower optical waveguide layer, an quantum wll (QW) active layer and an upper optical waveguide layer.

Referring to FIG. 1B, the ohmic contact layer 106 is covered by an insulating layer 107, and then photo lithographically masked by a photoresist pattern (not shown) to define the channels 108 having widths of about 20 μm and the ridge 109 having width of 2 to 5 μm along the cavity of the laser. The insulating layer 107 is etched through the photoresist pattern to expose the parts of the ohmic contact layer 106 over the channels 108. Then removing the photoresist pattern, the insulating layer 107 is used as the etching mask to subject the second upper cladding layer 105 to wet or dry etching to expose the etching stop layer 104.

Subsequently, another thick photoresist pattern 110 is deposited over the ridge 109 and parts of the first upper cladding layer 103 at both sides of the ridge 109 by means of photolithography, as shown in FIG. 1C. In this case, the width "A" of the photoresist pattern 110 covering the parts of the first upper cladding layer should be the same at both sides of the ridge 109 in order to have the ion implanted regions formed symmetrically about the ridge 109.

Si, B or H ions are implanted into the parts of the first upper cladding layer 103 and active layer 102 below the channels so as to form the ion implanted regions 111, as shown in FIG. 1D. The depth of the ion implanted region 111 depends on the acceleration energy of implanting ions, which is adjusted considering the thickness of the first upper cladding layer to make the ion implanted region penetrate the active region up to the upper part of the lower cladding layer 101.

Referring to FIG. 1E, after forming the ion implanted regions 111, the upper surface of the semiconductor laser is covered by an insulating layer 112 formed of $SiO_2$ or $Si_3N_4$ except for the parts of the upper surface of the ridge serving as the current paths. Then, through the lift-off and gold plating processes are formed p⁻ electrode 113 over the whole surface of the exposed parts of the ridge and n-electrode 114 over the underside of the substrate.

The ion implanted region 111 serves to absorb lights of 0.98 μm wavelength. In the semiconductor laser of RWG structure, the optical field distribution of the higher-order lateral mode is spread towards the channels, so that the lights of the first-order higher lateral mode are continuously absorbed, resulting in optical energy loss over the threshold value and thus cutting off the first-order higher lateral mode. Namely, it becomes possible to generate only the fundamental lateral mode lasing, which undergoes relatively less energy loss by the ion implanted region having the selective light absorption for the lateral modes.

When forming the ion implanted regions to absorb the first-order higher lateral mode lasing, the width of the ridge between the channels of the RWG semiconductor laser is 2 to 5 μm, and the diameter of the laser beam of the fundamental lateral mode about 5 μm regardless of the ridge width. Hence, the part of the ion implantation mask to cover the ridge should have the width greater than the ridge width to achieve the desired ion implantation. Besides, it is hardly possible due to the mask alignment error to make the photoresist pattern 110 cover the same width "A" at both sides of the ridge 109 in order to obtain the symmetrical ion implanted regions about the ridge. If the ion implanted regions are not symmetrical about the ridge, the fundamental lateral mode is absorbed by the ion implanted region formed nearer to the ridge under the high injection current, reducing the electro-optical conversion efficiency, and thus degrading the laser characteristics.

SUMMARY OF THE INVENTION

It is an object of the present invention to provide a method of fabricating a semiconductor laser of RWG structure, which may furnish symmetrical ion implanted regions about the ridge to prevent the higher-order lateral mode lasing and thus the beam steering of the optical output by means of self-aligned ion implantation.

It is another object of the present invention to provide a semiconductor laser of RWG structure which may sustain the fundamental mode lasing and prevent the higher-order lateral mode lasing from being absorbed by the ion implanted regions so as to secure the electro-optical conversion efficiency.

According to an embodiment of the present invention, a method of fabricating a semiconductor laser comprises the steps of sequentially depositing a lower cladding layer, an active layer, a first upper cladding layer, an etching stop layer, a second upper cladding layer and an ohmic contact layer over a compound semiconductor substrate, forming an etching mask over the ohmic contact layer so as to expose channel regions and to shield the ridge regions between the channel regions, performing wet etching to etch the ohmic contact layer and the second upper cladding layer so as to expose the etching stop layer so as to form the channels and the ridges having narrower widths than the parts of the etching mask shielding the ridge regions, and implanting dopant ions into the parts of the first upper cladding layer and the active layer below the channels to form ion-implanted regions by using the etching mask as the ion implantation mask.

According to another embodiment of the present invention, a method of fabricating a semiconductor laser comprises the steps of depositing a first $Ga_xIn_{1-x}As_yP_{1-y}$ layer on a GaAs substrate, sequentially depositing a GaInP lower cladding layer, a QW active layer, a first GaInP upper cladding layer, a GaAs etching stop layer and a second GaInP upper cladding layer over the first $Ga_xIn_{1-x}As_yP_{1-y}$ layer, sequentially depositing a second $Ga_xIn_{1-x}As_yP_{1-y}$ layer and an ohmic contact layer of GaAs over the second upper cladding layer, forming an etching mask over the ohmic contact layer so as to expose channel regions and to shield the ridge regions between the channel regions, performing wet etching to etch the ohmic contact layer, the second $Ga_xIn_{1-x}As_yP_{1-y}$ layer and the second upper cladding layer so as to expose the etching stop layer so as to form the channels and the ridges having narrower widths than the parts of the etching mask shielding the ridge regions, and implanting impurity ions into the parts of the first upper cladding layer and the active layer below the channels to form ion-implanted regions by using the etching mask as the ion implantation mask.

Thus, according to the present invention, the ion implanted regions are obtained by making the parts of the etching mask covering the width of the ridge between the channels protrude in the same width, so that the etching mask may be used as the ion implantation mask to produce the self-aligned ion implanted regions to secure the fundamental lateral mode lasing with preventing the higher-order lateral mode lasing.

The present invention will now described more specifically with reference to the drawings attached only by way of examples.

BRIEF DESCRIPTION OF THE ATTACHED DRAWINGS

FIGS. 1A to 1E schematically show cross sectional views for illustrating a conventional method of fabricating a semiconductor laser of RWG structure;

FIGS. 2A to 2D schematically show cross sectional views for illustrating an inventive method of fabricating a semiconductor laser of RWG structure by means of self-aligned ion implantation; and FIG. 3 is a schematic perspective view of the semiconductor laser fabricated by the inventive method according to the processing steps of FIGS. 2A to 2D.

DETAILED DESCRIPTION OF PREFERRED EMBODIMENTS

Figure 1A:
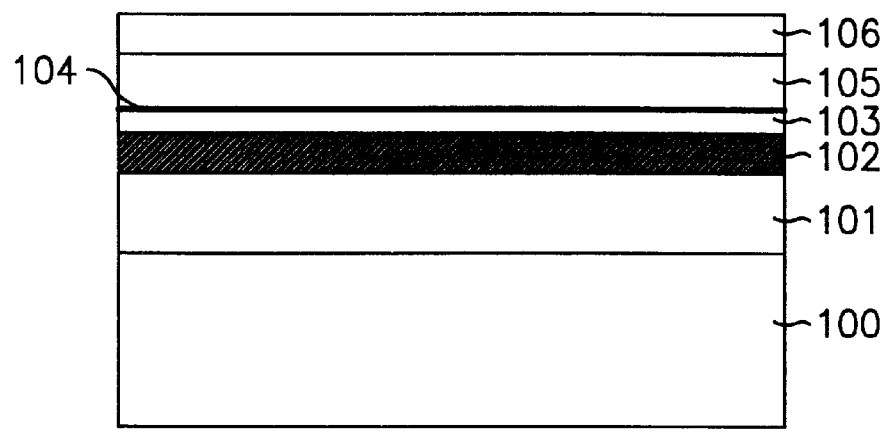
Figure 1B:
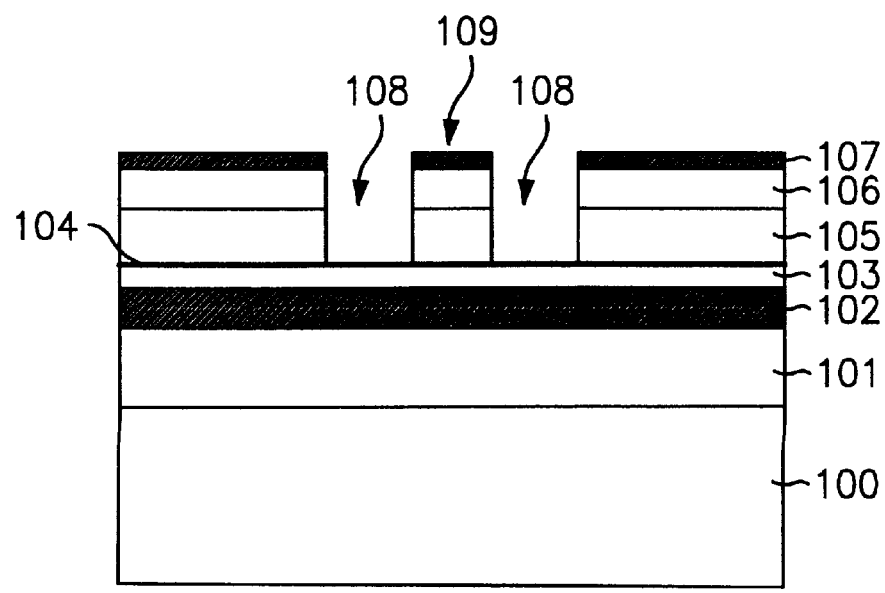
Figure 1C:
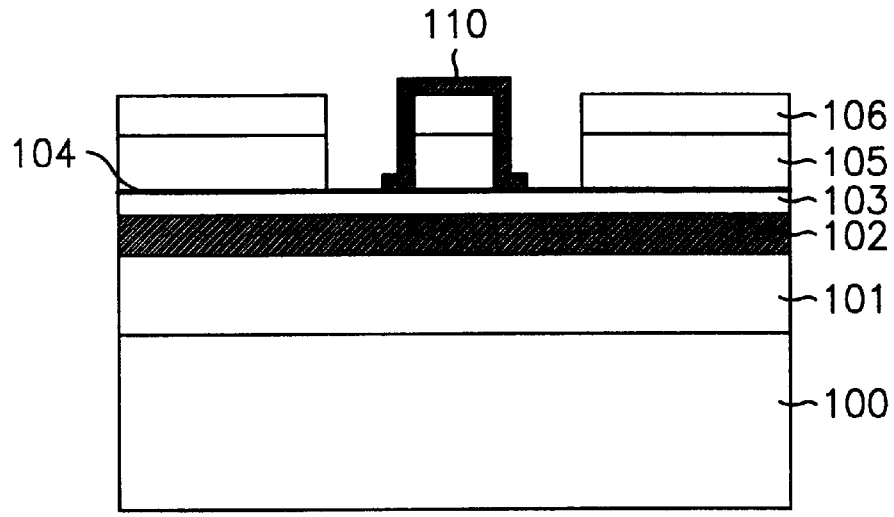
Figure 1D:
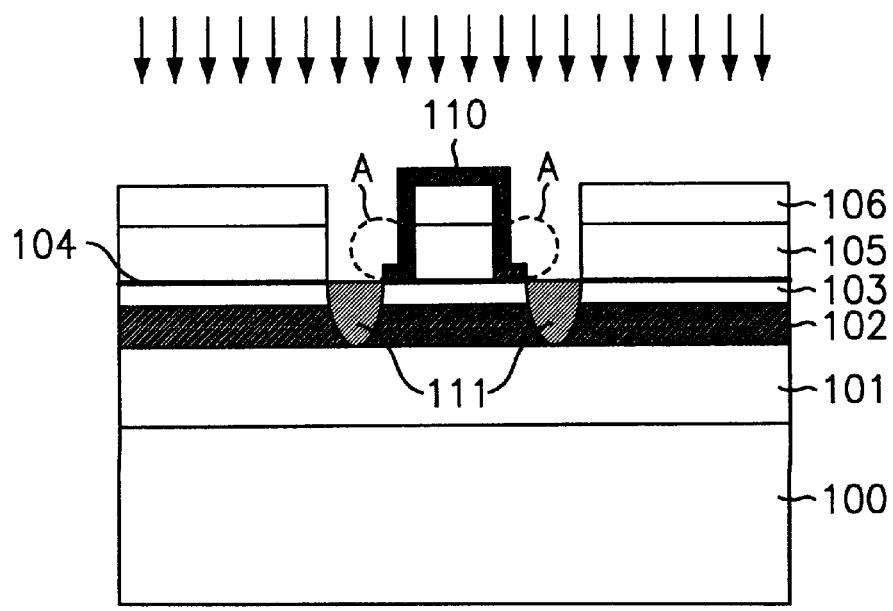
Figure 1E:
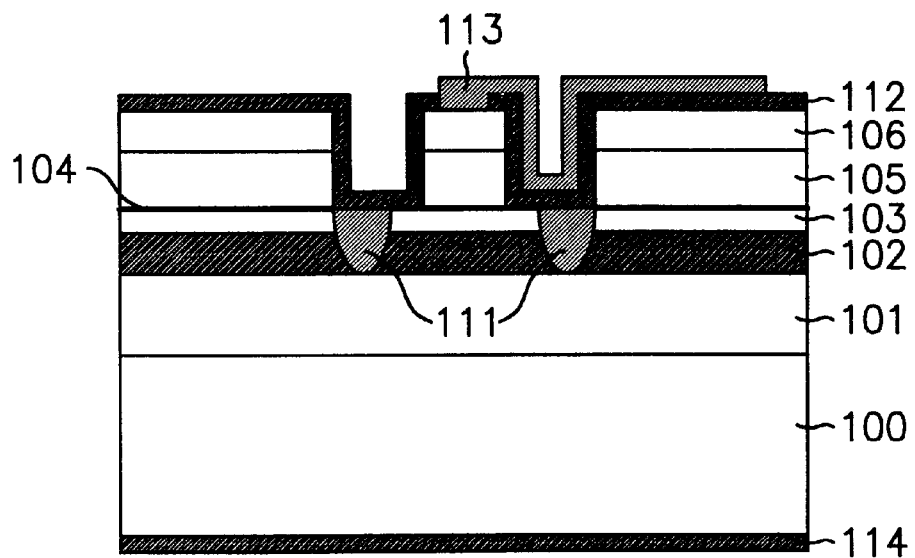
Figure 2A:
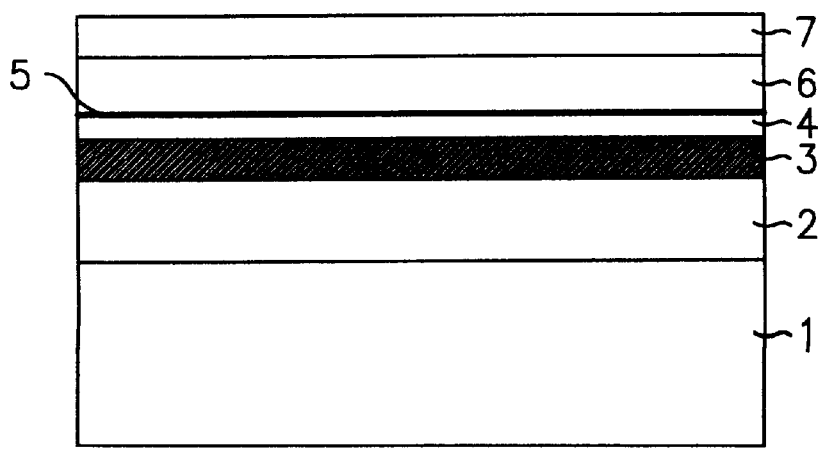

As shown in FIG. 2A, a 0.98 µm semiconductor laser of RWG structure is produced by sequentially growing a lower cladding layer 2, an active layer 3, a first upper cladding layer 4, an etching stop layer 5, a second upper cladding layer 6 and an ohmic contact layer 7 over a compound semiconductor substrate 1. When the substrate 1 and ohmic contact layer 7 are composed of GaAs, and the lower cladding layer 2 and the first and second upper cladding layers 4 and 6 of GaInP, there may be inserted a graded layer suitable composed of $Ga_xIn_{1-x}As_yP_{1-y}$ in order to eliminate the current spikes caused by the band gap difference between the two different materials.

Then, sequentially deposited over the ohmic contact layer 7 are an insulating layer 8 and a photoresist pattern 9 to expose the channel regions. The widths of the channel regions exposed along the length of the semiconductor laser are 20 µm, and the widths of the ridges between the channels 2 to 5 µm. In this case, the widths of the parts of the photoresist pattern 9 shielding the ridge regions are made to be at least 5 µm so as to exceed the diameter of the fundamental lateral mode and to include the end parts of the first-order higher lateral mode. Using the photoresist pattern 9 as the etching mask, the insulating layer 8 is dry-etched to expose the parts of the ohmic contact layer 7 over the channel regions, and then subjected to wet etching to form the ridge without removing the photoresist pattern 9. When the ohmic contact layer 7 is composed of GaAs, and the lower cladding layer 2 and the first upper and second upper cladding layers 4 and 6 of GaInP, the wet etching to form the ridge is carried out in one of the following three ways:

The first is to selectively etch the ohmic contact layer 7 by using a sulfuric acid selective etching solution composed of $H_2SO_4$, $H_2O$ and $H_2O_2$ to form the ridge having a desired width of 2 to 5 µm since the ohmic contact layer 7 has a different composition from the second upper cladding layer. Then, the second upper cladding layer 6 is etched so as to expose the etching stop layer 5 by using a selective etching solution composed of $H_3PO_4$ and HCl. If there exists a graded layer of $Ga_xIn_{1-x}As_yP_{1-y}$ between the ohmic contact layer 7 of GaAs and the second upper cladding layer 6 of GaInP, the etching speed of the sulfuric acid solution depends on the composition of the graded layer, e.g., becoming faster or slower according as it has a similar band gap with the GaAs layer or GaInP layer. Hence, it is difficult to achieve the desired ridge width in this way.

The second is to use an etching solution of BPK series composed of HBr, $H_3PO_4$, $K_2Cr_2O_7$, whose etching speed does not depend on the composition of the $Ga_xIn_{1-x}As_yP_{1-y}$ layer, in order to etch the ohmic contact layer 7, graded layer and parts of the second upper cladding layer 6 so as to obtain the desired ridge width. Subsequently, a selective etching solution composed of $H_3PO_4$ and HCl is used to only etch the second upper cladding layer 6 so as to expose the etching stop layer 5.

The third is to etch the ohmic contact layer 7 so as to obtain undercuts of the desired width by using the sulfuric acid selective etching solution composed of $H_2SO_4$, $H_2O$ and $H_2O_2$. Then, the etching solution composed HBr, $H_3PO_4$, $K_2Cr_2O_7$ is used to etch the graded layer of $Ga_xIn_{1-x}As_yP_{1-y}$ and a part of the second upper cladding layer 6. The second upper cladding layer is etched so as to expose the etching stop layer 5 by using the selective etching solution composed of $H_3PO_4$ and HCl, finally producing the ridge.

Figure 2B:
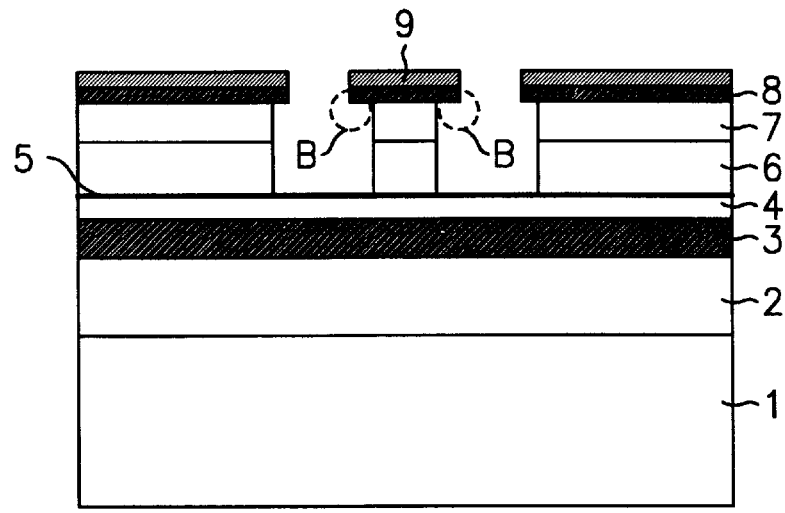

Thus, as shown in FIG. 2B, there are formed the symmetrical undercuts "B" at both sides of the ridge, so that the ion implanted regions are symmetrically formed at both sides of the ridge with the same intervals. This eliminates the additional process for forming a photoresist pattern to serve as the ion implantation mask, and thus prevents the ion implanted regions from being asymmetrically formed at both sides of the ridge because of the mask alignment errors.

Figure 2C:
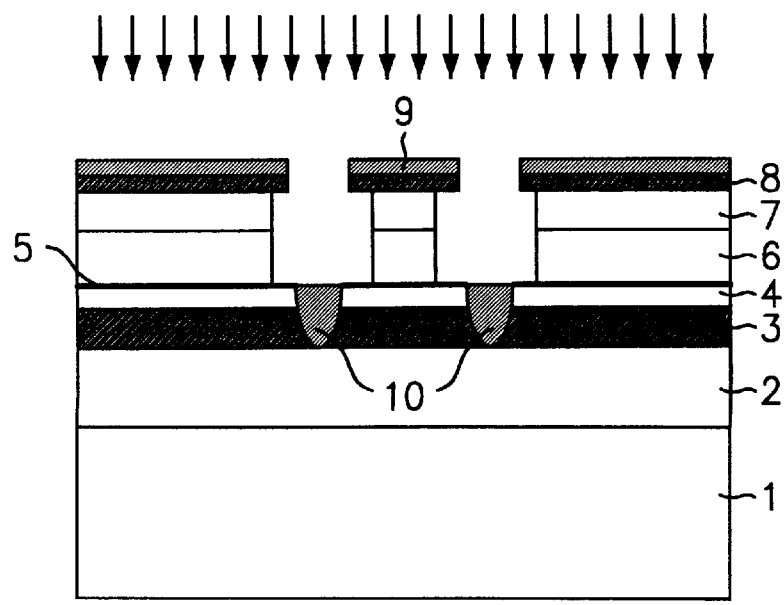

Subsequently, Si, B or H ions are implanted into the parts of the first upper cladding layer below the channels by using the insulating layer 8 and photoresist 9 as the ion implantation mask to so as to form the ion implanted regions 10, as shown in FIG. 2C. The depth of the ion implanted region 10 depends on the acceleration energy of implanting ions, which is adjusted considering the thickness of the first upper cladding layer to make the ion implanted region 10 penetrate the active region 3 up to the lower cladding layer 2.

Figure 2D:
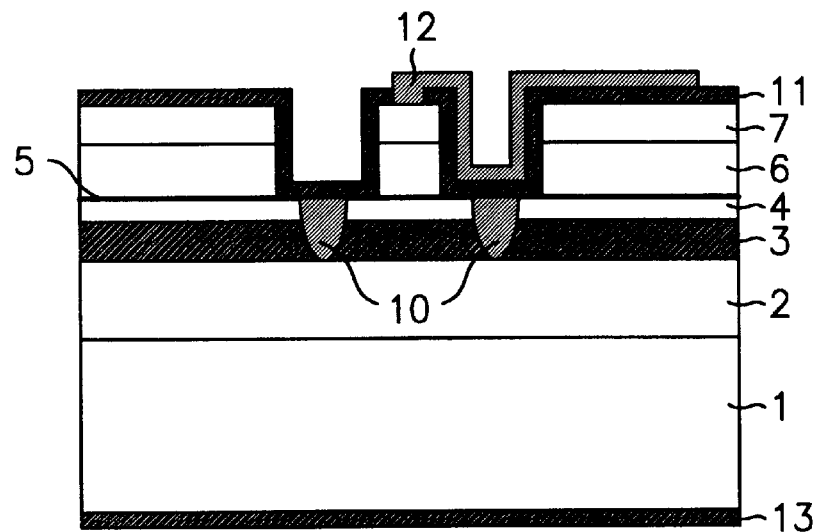
Figure 3:
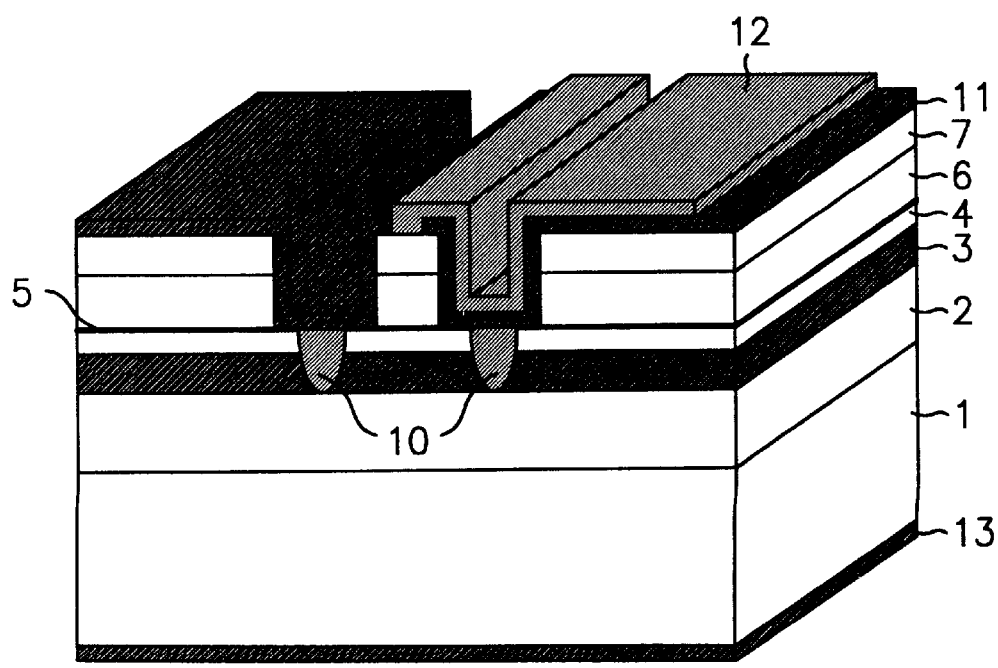

After removing the photoresist pattern 9 and the insulating layer 8, the upper surface of the semiconductor laser is covered by an insulating layer 11 formed of $SiO_2$ or $Si_3N_4$ except for the parts of the ohmic contact layer 7 on the ridge serving as the current paths, as shown in FIG. 2D. Then, through the lift-off and gold plating processes are formed p⁻ electrode 12 over the whole surface of the exposed parts of the ridge and n⁻electrode 13 over the backside of the substrate. The high power 0.98 $\mu$m semiconductor laser chip thus obtained is illustrated in FIG. 3.

Conclusively, the inventive method provides means to keep the width of the active layer of the RWG semiconductor laser in a desired value (2 to 5 $\mu$m) as well as to prevent the fundamental lateral mode from being absorbed by the ion implanted regions, thereby securing the electro-optical conversion efficiency to prevent degradation of the laser characteristics. Reiterating, the width of the parts of the insulating layer 8 and photoresist pattern 9 to shield the ion implantation is made to have the value of 7 $\mu$m greater than the beam diameter 5 $\mu$m of the fundamental lateral mode, and the wet etching is performed to form the ridge and to expose symmetrically the regions to implant ions at both sides of the ridge with the same intervals, so that the ions are implanted through the insulating layer and photoresist pattern by self-alignment. Thus the first-order higher lateral mode lasing in the regions wider than the beam diameter 5 $\mu$m of the fundamental lateral mode under high injection current is absorbed by the ion implanted regions without adversely affecting the fundamental lateral mode, thus preventing the beam steering.

While the present invention has been described in connection with specific embodiments accompanied by the attached drawings, it will be readily appreciated that various changes and modifications may be made thereto without departing the spirit of the invention.

What is claimed is:

1. A method of fabricating a semiconductor laser comprising the steps of:

sequentially depositing a lower cladding layer, an active layer, a first upper cladding layer, an etching stop layer, a second upper cladding layer and an ohmic contact layer over a compound semiconductor substrate;

forming an etching mask over said ohmic contact layer so as to expose channel regions and to shield the ridge regions between said channel regions;

performing wet etching to etch said ohmic contact layer and said second upper cladding layer so as to expose said etching stop layer so as to form the channels and the ridges having narrower widths than the parts of said etching mask shielding said ridge regions; and implanting dopant ions into the parts of said first upper cladding layer and said active layer below said channels to form ion-implanted regions by using said etching mask as the ion implantation mask.

2. A method as defined in claim 1, wherein the widths of the channel regions exposed through said etching mask along the cavity of said semiconductor laser are 20 $\mu$m, the widths of said ridges 2 to 5 $\mu$m, and the widths of the parts of said etching mask shielding said ridge regions at least 5 $\mu$m so as to exceed the diameter of the fundamental lateral mode and to include the end parts of the first-order higher lateral mode.

3. A method as defined in claim 1, wherein said ion-implanted regions penetrate said active layer to contact said first upper cladding layer.

4. A method of fabricating a semiconductor laser comprising the steps of:

depositing a first $Ga_xIn_{1-x}As_yP_{1-y}$ layer on a GaAs substrate;

sequentially depositing a GaInP lower cladding layer, an active layer, a GaInP first upper cladding layer, a GaAs etching stop layer and a GaInP second upper cladding layer over said first $Ga_xIn_{1-x}As_yP_{1-y}$ layer;

sequentially depositing a second $Ga_xIn_{1-x}As_yP_{1-y}$ layer and an ohmic contact layer of GaAs over said second upper cladding layer;

forming an etching mask over said ohmic contact layer so as to expose channel regions and to shield the ridge regions between said channel regions;

performing wet etching to etch said ohmic contact layer, said second $Ga_xIn_{1-x}As_yP_{1-y}$ layer and said second upper cladding layer so as to expose said etching stop layer so as to form the channels and the ridges having narrower widths than the parts of said etching mask shielding said ridge regions; and implanting dopant ions into the parts of said first upper cladding layer and said active layer below said channels to form ion-implanted regions by using said etching mask as the ion implantation mask.

5. A method as defined in claim 4, wherein said fifth step of performing wet etching further includes the steps of:

first etching said ohmic contact layer and said second $Ga_xIn_{1-x}As_yP_{1-y}$ layer by using a sulfuric acid selective etching solution composed of $H_2SO_4$, $H_2O$ and $H_2O_2$; and second etching said second upper cladding layer so as to expose said etching stop layer by using a selective etching solution composed of $H_3PO_4$ and HCl.

6. A method as defined in claim 4, wherein said fifth step of performing wet etching further includes the steps of:

first etching said ohmic contact layer, said second $Ga_xIn_{1-x}As_yP_{1-y}$ layer and a part of said second upper cladding layer by using an etching solution composed HBr, $H_3PO_4$, $K_2Cr_2O_7$; and second etching said second upper cladding layer so as to expose said etching stop layer by using a selective etching solution composed of $H_3PO_4$ and HCl.

7. A method as defined in claim 4, wherein said fifth step of performing wet etching further includes the steps of:

first etching said ohmic contact layer so as to obtain undercuts of a desired width by using a sulfuric acid selective etching solution composed of $H_2SO_4$, $H_2O$ and $H_2O_2$ second etching said second $Ga_xIn_{1-x}As_yP_{1-y}$ layer and a part of said second upper cladding layer by using an etching solution composed HBr, $H_3PO_4$, $K_2Cr_2O_7$; and third etching said second upper cladding layer so as to expose said etching stop layer by using a selective etching solution composed of $H_3PO_4$ and HCl.

* * * * *